United States Patent [19]

Graf et al.

[11] Patent Number: 4,842,827

[45] Date of Patent: Jun. 27, 1989

[54] VACUUM VAPOR TRANSPORT CONTROL

[75] Inventors: Hans-Juergen Graf, Oceanside; Robert E. Fletcher, Vista; Peter T. Randtke, San Marcos; Bruce E. Rhine; J. R. Monkowski, both of Encinitas, all of Calif.

[73] Assignee: Air Products and Chemicals, Inc., Allentown, Pa.

[21] Appl. No.: 948,120

[22] Filed: Dec. 30, 1986

Related U.S. Application Data

[63] Continuation of PCT US85/01780 filed Sep. 10, 1985, Published as WO87/01614 on Mar. 26, 1987.

[51] Int. Cl.⁴ .............................................. B01J 19/00
[52] U.S. Cl. ...................................... 422/112; 118/50; 122/412; 422/109; 422/129; 427/248.1
[58] Field of Search ............... 422/109, 112, 129, 127; 122/412; 118/50; 427/248.1

[56] References Cited

U.S. PATENT DOCUMENTS 4,444,734  4/1984  Mastrud et al. ................ 422/129 X Primary Examiner—Barry S. Richman
Assistant Examiner—Jill Johnston
Attorney, Agent, or Firm—James C. Simmons; William F. Marsh

[57] ABSTRACT

A vacuum vapor transport control system and method for controlling the rate of vapor flow from a reagent reservoir into a vacuum system through an orifice calibrated as to size or flow rate using a high purity fixed gas and vapor provided from multiple reservoirs or mixed vapor provided from a single reservoir.

10 Claims, 3 Drawing Sheets

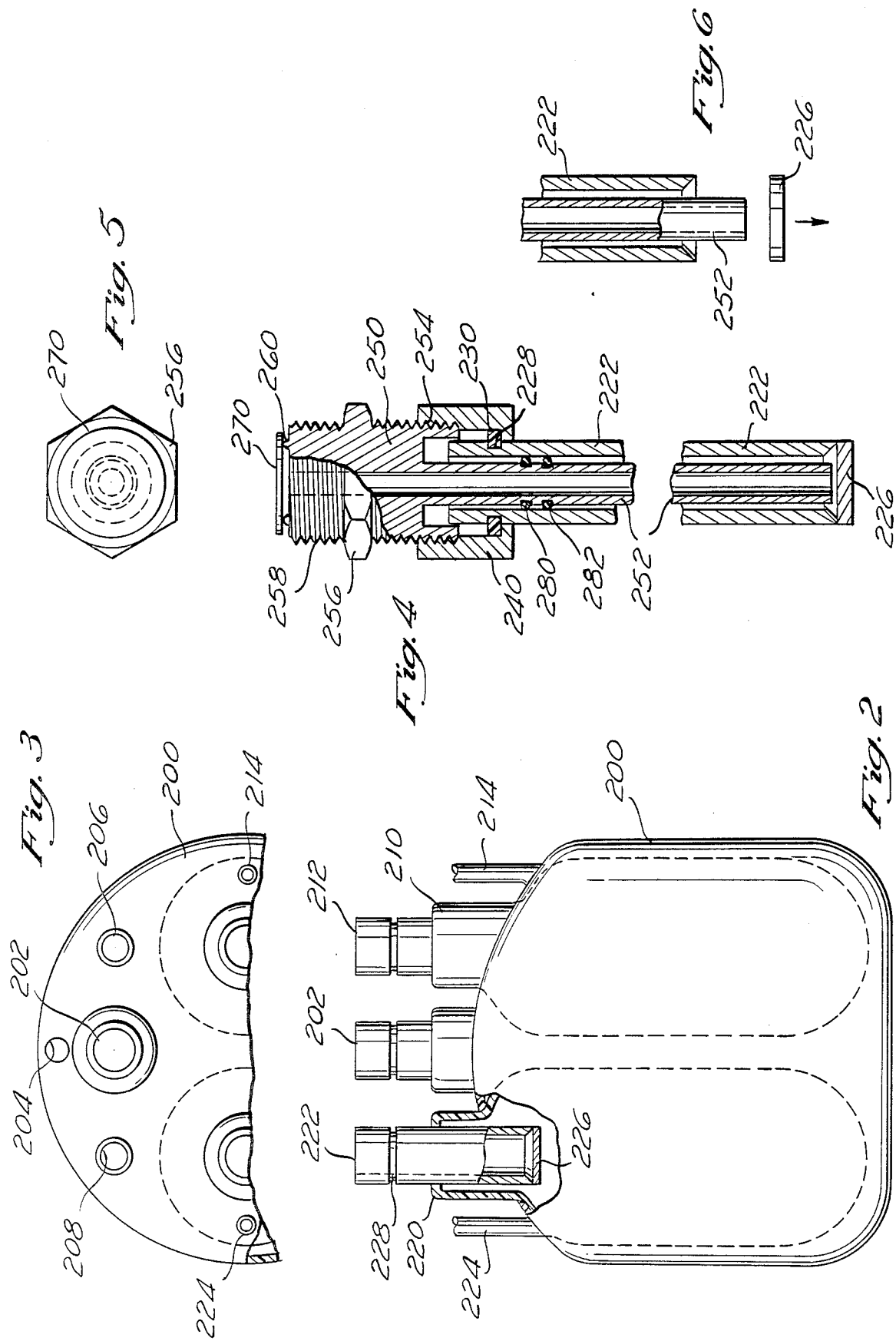

VACUUM VAPOR TRANSPORT CONTROL

This application is a continuation of PCT/US85/01780, filed 9/10/85 published as WO87/01614 on Mar. 26, 1987.

FIELD OF THE INVENTION

The invention relates to the manufacture of semiconductors and, specifically, to the control of the flow rate reagent vapor through a orifice into a vacuum system utilized in the manufacture of semiconductor devices.

BACKGROUND OF THE INVENTION

It is well known in the art to carry out certain semiconductor and manufacturing operations under conditions of high or moderate vacuum. One of the conventional processes in carrying out such operations is to introduce a reagent vapor into the vacuum system where the vapor reacts with the semiconductor devices undergoing treatment or preparation. It is extremely important, in many of these operations, that the rate of reagent vapor flow into the vacuum system, and consequently, the rate of reaction of the reagent vapor with the semiconductor surface be very precisely controlled.

A number of methods of introduction of reagents into vacuum furnaces and other vacuum semiconductor manufacturing systems are known. Most of the systems are very difficult to operate under conditions which will assure that aerosol of the reagent is formed, and to assure also that mass flow rate is accurate and repeatable. One feature of this invention resides in the provision of a critical orifice system for introducing vapor into such vacuum systems accurately with no risk of aerosol formation.

Systems are well known for providing reagents in reservoirs or bubblers and for maintaining the temperature of reservoir or bubbler as desired to obtain the desired vapor pressure. One such system is sold by J. C. Schumacher Company identified as the STC or Source Temperature Controller. The STC is, in brief description, an enclosure for the reservoir and heating means and controlling means for very precisely maintaining the temperature of the reservoir.

Systems are well known for providing a precisely controlled mass flow of inert gas, e.g. nitrogen. One such system is sold by the J. C. Schumacher Company as the MFC or Mass Flow Controller. The MFC includes inlet and outlet valves and an orifice control device and flow meter.

SUMMARY OF THE INVENTION

The present invention includes a system, means and method for controlling the rate of vapor flow into the vacuum system from a reagent reservoir is to provide a conduit means from the reagent reservoir to the inlet of an orifice, and connect the outlet of the orifice to the vacuum system. A pressure differential is maintained across the orifice which is a function of the temperature of the reagent vapor specifically, into the system generally. The flow rate, then, is a function of the pressure differential across the orifice, the size of the orifice and the temperature of the reagent vapor.

A very advantageous feature of this system is that so long as the pressure at the inlet of the orifice is at least twice as great as the pressure at the outlet of the orifice, the outlet of the orifice being at a high or moderate vacuum, in the range of about 0.001–100 Torr, the flow rate is independent of the pressure differential. Under such circumstances, at constant temperature, the flow rate is a function only of the orifice size. A number of problems have been encountered using critical orifices. Among such problems is the changing of the orifice size. The effective size of the orifice changes over a period of time and over a period of operation, presumably by reason of the condensation of the reagent vapor on components of the orifice, chemical reaction of the reagent vapor with the orifice materials, and perhaps abrasion resulting from impingement of the vapor particles upon the surfaces of the orifice. In any event, the effective size of the orifice changes over a period of time and operation. This would necessitate the careful calibration and recalibration of the orifice and adjustment of flow parameters to assure that a predetermined and desired rate of mass flow is accomplished through the orifice.

An important facet of this invention is that it provides a critical orifice and a means and a system for calibrating the orifice to provide for a predetermined mass flow rate through the orifice under known conditions.

Reservoirs in the form of bubblers and in other forms are well known in the industry. One of the industry standards is the quartz bubbler sold by J. C. Schumacher Company. Such bubblers may be used in connection with the critical orifice system of this invention; however, an improved reservoir and an improved seal arrangement are important facets of this invention.

Breakseals on quartz or glass containers are known, and a unique breakseal arrangement is involved in the J. C. Schumacher Company Bubbler design. Such breakseals, however, are limited to rather small diameters. An important feature of this invention is a large diameter breakseal which obviates the introduction of small particles into the reagent vessel.

Methods and apparatus for generating vapors at a desired pressure are also known. Generally, however, such systems are limited to a single vapor and are not satisfactory for providing a mixed vapor at a constant composition and pressure. Another important facet of this invention lies in a new and improved mixed vapor generator system, apparatus and method.

A vacuum vapor transport control system for controlling the flow rate of chemical reagent into a vacuum system from a reservoir of the chemical reagent is described which comprises a critical orifice having an inlet and an outlet, vapor inlet means for conducting vapor of the reagent from the reservoir to the orifice inlet, vapor outlet means for connecting the orifice outlet to the vacuum system into which the reagent vapor is to be controllably allowed to flow.

In one preferred embodiment means are provided for selectively causing either reagent vapor or a high purity fixed gas at a precisely known flow rate to pass through the orifice for thereby periodically calibrating the orifice using the fixed gas as the calibrating medium.

In another preferred embodiment, the orifice is controllable as to orifice size and includes means for adjusting the orifice size to allow a predetermined flow rate of the calibrating gas to flow therethrough.

The system also preferably comprises means for deriving an inlet pressure signal which is a function of the pressure at the inlet and an outlet pressure signal which is a function of the pressure at the outlet and means for adjusting the vapor pressure of the reagent vapor in the vapor inlet means to maintain a predetermined ratio of inlet pressure to outlet pressure.

The invention also contemplates a method of controlling the rate of reagent vapor transport from a reservoir of reagent to a vacuum system comprising during operation passing the vapor from the reservoir to the vacuum system through an orifice having an inlet and an outlet and during a period of non-operation, passing a high purity fixed gas stream of known mass flow rate through the orifice, the orifice being calibrated during such non-operation period as to mass flow capacity using the high purity fixed gas stream as the reference mass flow.

The method preferably includes the steps of deriving an inlet signal which is a function of the vapor pressure at the orifice outlet and controlling the vapor pressure from the reservoir to obtain a predetermined ratio of inlet vapor pressure to outlet vapor pressure.

In systems wherein the orifice is adjustable the method includes the step of adjusting the orifice size during calibration to allow a predetermined mass flow of calibrating high purity fixed gas through the orifice.

BRIEF DESCRIPTION OF THE DRAWINGS

FIG. 2 is a side view, partially cut away, of a multiple reservoir.

FIG. 3 is a partial top view of the multiple reservoir apparatus of FIG. 2, in partial cut away, showing one half of the top, including the top of the three reservoirs.

FIG. 4 is a side view partially in cut away and cross section showing the improved breakseal of the invention and a connector therefor.

FIG. 5 is a top view of the connector shown in FIG. 4.

FIG. 6 is a side view in partial cross-section of the bottom of the breakseal during breaking.

DESCRIPTION OF THE PREFERRED EMBODIMENT

Figure 1:
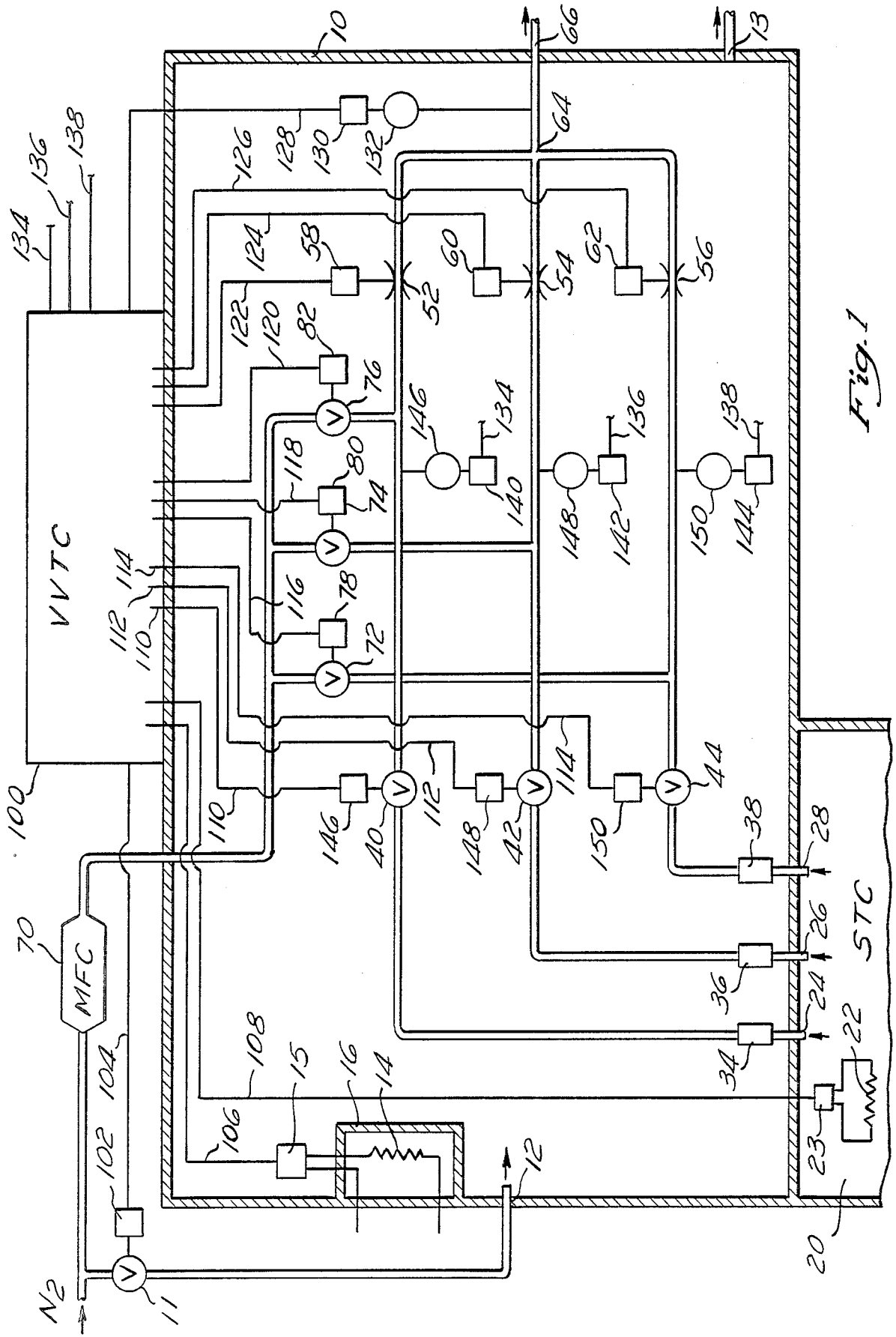
FIG. 1 is a schematic view of the critical orifice and calibration system of this invention.

Referring first to FIG. 1, the system and method of operation of the system will be described.

The system involves, in the preferred embodiment, an enclosure 10 which is substantially gas tight and is maintained, preferably, under an inert atmosphere, for example under a nitrogen gas blanket. This is not essential to or critical in the operation of the invention but is an important safety feature which would typically be included within the scope of the invention. A nitrogen source is provided and flow is controlled through valve 11 to an inlet 12 to the enclosure.

Another enclosure 20 in or adjacent the enclosure 10, includes reservoirs of the reagent which is to be vaporized and utilized in the semiconductor manufacturing system to which the vapors fit from the vacuum vapor transport control system of this invention. A vent 13 permits nitrogen to escape. The inside of the enclosure 10 may be maintained at a desired temperature by a heater 14 and controller 15 in enclosure 16 inside enclosure 10. The vapor pressure of the reagent in the system of this invention may be controlled in any manner but it is convenient to control it by controlling the temperature of the reagent by means of a heater 22 and a controller 24.

The conduits, orifices, and other flow controlling and flow handling devices of the system are maintained at a temperature above the temperature of the reagent reservoir. For example, the reagent reservoir may typically be maintained at a temperature of around 90° C. In such cases, the system would be maintained at a temperature of, for example, 95° C. to avoid condensation in the system.

The reagent flow is from the conduit 24, 26 and 28, and enclosure 20 through conventional connectors, or the improved connector of the invention which will be described later on, identified at 34, 36 and 38 and then through controlled valves of 40, 42 and 44 which are, respectively, controlled by controllers 46, 48 and 50. The flow is then to the respective orifice mechanisms shown at 52, 54 and 56. In the preferred embodiment, these orifice are variable and can be controlled by controllers 58, 60 and 62 respectively. Through the controlled or fixed orifice 52, 54 and 56, the flow of the gas is then mixed at a TEE mixer 64 which is connected to the inlet 66 of the users vacuum furnace or other vacuum system. Flow is shown by the arrows at the inlet and outlet of the conduits in the figure.

Calibration is provided from a source of nitrogen through a mass flow controller 70 of the type discussed previously as currently sold by J. C. Schumacher Company or any other desired mass flow controller. A stream of nitrogen at known mass flow rate may be introduced into the vapor conduit system through valves 72, 74, and 76, individually, which the valves are, in turn, controlled by valve controllers 78, 80, and 82. By this means, nitrogen at a known mass flow rate may be introduced into any one of the conduits and caused to flow through any one of the orifices, thus providing a known mass flow rate stream of nitrogen which is used to calibrate the orifice. Microprocessors and microprocess control systems for industrial control purposes are very widely known and generally used. There is no particular novelty in such systems with respect to this invention. Indeed, any controller system which can provide the desired functions may be used and any one with ordinary skill in the art would be able to design or provide such controllers. The controller for the overall system in this invention is referred to as VVTC or Vacuum Vapor Transport Controller and is indicated generally at 100. Control of the in flow of nitrogen to the enclosure 10 is maintained through a controller 102 and a control line 104. This is a very simple control function, simply turning the valve on and off to maintain a nitrogen cover in the enclosure. A like system that may be used to maintain a nitrogen blanket in the STC.

Temperature in the enclosure 10 is maintained at the desired level using the heater 14 and the controller 15 through control line 106. Simarily, temperature in the source temperature control system is maintained through a heater 22 at controller 24 and a control line 108. Control lines 110, 112 and 114 control the valves 40, 42 and 44 and, consemately, the flow into the orifices. Control lines 116, 118 and 120, respectively, control the valves 72, 74 and 76 to permit calibrating flow of nitrogen when desired. Control lines 122, 124 and 126 control the size of the respective orifices 52, 54 and 56. A line 128 from a transducer 130 and a pressure sensor 132 indicate the vacuum pressure into which the vapors to be transported. In a similar manner, control lines 134, 136 and 138 from transducers 140, 142 and 144 transmit pressure readings from pressure sensors 146, 148 and 150 to the VVTC.

In operation, before startup, nitrogen is allowed to flow into the respective conduits and through the respective orifices at a known mass flow rate, as determined by the mass flow controller 70. During such flow, the effective orifice size can be calculated or determined from a calibration curve either provided by the manufacturer of the orifice or developed by standard calibration techniques. Once the effective orifice size is known, then the orifice is either adjusted or the effective orifice size is used in determining the mass flow rate of the reagent, during the run. This procedure is repeated for each of the orifices, after which the run has begun. Control for this calibration is, of course, provided by the valves 72, 74 and 76. Once the calibration is complete, these valves are closed and the valves 40, 42 and 44 are opened allowing flow of the reagents from the conduits 24, 26 and 28 through the system and through the orifices. The output of the orifices is connected to the TEE mixer 64 and the mixed vapors then flow into the vacuum furnace, rather vacuum device. It will be understood that one or more of the critical orifice assemblies may be used. Three are shown because this is a conveniently configured system and because two or three reagents are commonly used in the manufacture of semiconductors.

The critical mass flow equation for an ideal orifice is:

$$M_{crit} = 19.64 \ C_v \left(\frac{MW}{R_oT}\right)^{\frac{1}{2}} P_1 D^2 \text{ g/sec}$$

where:
$C_v$ = orifice
MW = gas molecular weight
T = °K
R = constant, 62,364
$P_1$ = upstream (servoir) pressure, torr
D = orifice 0, cm.

This is valid as long as $P_1 \geq 0.535 \ P_2$, the downstream pressure. In general, $P_2$ will be 1 - 5 torr.

Table I presents a typical example orifice size ranges for exemplary reagents.

TABLE I

| Source | MW  | T (°C.) | $P_1$ (torr) | M (gm/min) | D (cm)        |
|--------|-----|---------|--------------|------------|---------------|
| TEOS   | 208 | 90      | 70           | 2.34       | 0.102 (0.040") |
| TMP    | 140 | 90      | 30           | 0.78       | 0.099 (0.039") |
| TEB    | 146 | 90      | 300          | 0.78       | 0.031 (0.012") |

TEOS = Tetraethyl (ortho) silicate
TMP = Trimethyl phosphate
TEB = Tetraethylborate The control valve of choice is the MKS Inc., model 248A Control Valve modified for 125°operation, female VCR fittings and Kalvez Valve Seats. The flow range is selected as follows.

Consider TEOS with an M of 2.34 gm/min. The required gas flow rate in liters/min at specified conditions is 90° C., 70 torr:

$$\text{Flow} = 22.4 \ 1. \ \frac{M}{(MW)} \ 760 \ \frac{\text{torr}}{(P)} \ \frac{T}{(273 \ C)}$$

$$= 22.4 \ \frac{2.34}{(208)} \ \frac{760}{(70)} \ \frac{363}{(273)}$$

$$= 3.64 \text{ liters/min}$$

The equivalent values for TMP and TEB are 4.20 and 0.403 lt/min respectively. Below 100 torr, the pressure drop across the valve increases significantly and the conduction drops off due to the restricted flow path through the orifice valve body. This can be compensated for by specifying a valve with a much higher range but with sacrifice in resolution capability. MKS recommends a valve with a 0–50 standard liters per minute range for minimum pressure drop.

Each channel of the vacuum vapor transport system is programmed to deliver a fixed mass flow at a given temperature, pressure and orifice valve opening (i.e., via an applied voltage to the orifice valve controller). An example is TEOS at 90° C., 70 torr and an mass flow of 2.34 gm/min. In reality, the orifice will slowly narrow as deposits form on the walls. As the orifice is varied to maintain the pressure, the actual mass flow will slowly drift due to this effect.

In order to provide periodic mass flow calibrations, an auxiliary mass flow controller (70) is provided, which is never exposed to the corrosive gases and therefore is a stable reference. It's operation is as follows.

As FIG. 1 shows, during calibration valves 40, 42 and 44 are gated to the normall closed position. $N_2$ is then routed through the MFC 70 to the individual control valves via 72, 74 and 76. As long as the input to the MFC 70 is greater than atmospheric pressure, the control valve on the MFC can be programmed to establish the prescribed pressures and mass flows for each channel. For example, if Table I is used as a starting point, voltages to the control orifice of the MFC 70 can be established which generate pressures of 70, 30 and 300 torr in each channel when an equivalent set of voltages are applied to the orifice controllers in the channel themselves.

An example is regard to TEOS is as follows. At the factory, a calibration relationship is established between the voltage V1 and the voltage control orifice 52 to establish a known mass flow of $N_2$ at 70 torr and 90° C. and the voltage applied to the control orifice of the MFC. $N_2$ would be regulated at 5 psi on the upstream side of the MFC. Assume that a voltage of 10 VDC applied to the control orifice of the MFC provides a flow of 250 sccm at atmospheric pressure and room temperature into the vacuum which is governed by the applied voltage of controller 58. In operation, a calibration run is automatically made before each run. Essentially predetermined voltages, based on calibration curves are applied to critical orifice 52 and the MFC and the mass flow is sensed by the MFC. If there is a variance in the mass flow and pressure, the voltage is adjusted in order to compensate. This procedure is done on each channel and then the system is ready for a run.

Conventionally, three separate reservoirs are utilized for the reagents. There is a significant advantage, however, in utilizing a multiple reservoir apparatus. The costs of shipping and the hazards of shipping multiple containers is reduced by the utilization of a single apparatus containing multiple reservoirs, such as that shown in FIG. 2, which depicts a new and very advantageous embodiment of one facet of the invention.

Referring to FIG. 2, an outer container 200 forms a first vessel. An opening 202, which is identical to openings 212 and 222, the latter of which will be described in complete detail hereinafter, are provided for removing vapors from the reservoir during use. A fill tube 204, which, in operation, is simply a long open tube through which reagent is introduced into the reservoir after which the fill tube is closed off, typically by heat sealing.

A thermal well 206 is provided into which a temperature sensing probe can be positioned and another well 208 is provided into which an optical level measuring device may be inserted. These are simply tubes, closed at the bottom, and, therefore, seal to prevent inclusion of the reagent, which are utilized in measuring the temperature and level of the reagent. Such wells are known in the prior art and, per se, are not novel, except in combination with the other features of this particular embodiment of the invention.

Another vessel 210 is formed inside and connected to the top wall of the vessel 200 and is same as conduit 202 and 222. A fill tube 214, as previously described with respect to fill tube 204 is also provided for this vessel.

In like manner, a vessel 220, with a vapor removal conduit 222 and a fill tube 224 are provided. It will be seen, that the combination comprises a unitary vessel comprising an outer reservoir with two reservoirs suspended from the top wall of the vessel in the outer reservoir, forming three separate and distinct reservoirs, each of which has a fill tube and each of which is provided a vapor removal conduit.

The lower end of the vapor removal tube is tapered out to a fine edge. The taper may be toward the outer edge, the inner edge, or may be generally centered with respect to the thickness of the wall of the vapor removal tube 222 provided only that a knife edge, in annular configuration, is formed to which a closure disk 226 is fused. This combination forms a very unique and advantaneous breakseal. First of all, the breakseal 226 on the end of the tube 222 is comparably thick and may be as thick as or thicker than the walls of the tube and, therefore, can withstand virtually any expected internal pressure. In particular, it can withstand the forces of hydraulic pressure applied during movement of the vessel and the relative movement therein of the liquid contained in the vessel. This has been a serious problem in the past and the present invention provides a unique, unexpected and very advantageous solution to this problem.

Another important facet of this particular feature of the invention resides in the matter of breaking the breakseal. While the breakseal may be broken in any of many ways, one particular advantageous apparatus in system for breaking the seal is shown in FIG. 4 and in FIG. 5. As shown in FIG. 2, there is a groove 228 formed in the out wall of the vapor removal tube 222. As shown in FIG. 4, that groove 228 has residing in it a retaining ring 230 which may be of any polymeric or even metal material. Polymer, such as polytetrafluoroethylene, sold under the trademark TEFLON, or any other desired polymer are preferred. The retaining ring or washer 230 resides in the groove 228. The retainer washer 230 retains on the vapor removal tube 222 a nut or retainer 240 which is threaded on its internal surface. Obviously, parts may be reversed and the threading may be on the outside but it is conveniently shown here on the inside.

The nut fits on a connector 250, which includes a down tube 252 which extends proximate of the end of the vapor removal tube 222, as shown in FIG. 4 and 6. An outer portion of the connector 250 is threaded and is threadably engaged by the threads on the nut 230. A hexangular or other gripping surface 256 may be provided an and upper threaded surface 258 may also conveniently be provided for connecting the connector to any kind of tubing or conduit system desired. Since this is a conventional VCR connector from this point on, the description is omitted for sake of brevity and clarity. Briefly, however, an annular rib 260 is formed on the end of the body and a washer 270 of some deformable material, which may be metal or polymer, for example, is placed thereon and a mating fitting, which would be substantially identical, if desired, with respect to the threaded end 258, is provided for engaging the other side, the top sided as shown in FIG. 4, of the washer 270. The two portions mate together and are forced together by a nut which threadably engages the portion 258. As indicated, this is a conventional connector and there is no novelty per se and the assembly shown at the top of FIG. 4.

An important facet of the invention, however, comprises the assembly of means for extending outwardly all the vapor removal tube 222, means secured, as for example by the washer 230, over the end of the vapor removal 222, i.e. the nut 240, and means for securing the body 250 to a nut 230 and for moving the body, and particularly, it's downwardly extending portion 252. Sealing O rings 280 and 282, formed in grooves in the outer wall of the down tube 252 are provided to provide a sealing relationship between the interior of the vapor removal tube and the exterior of the down tube 252.

In use, the nut 240 is slipped over the end of the vapor removal tube and the retaining ring 230, which is typically at least somewhat resilient, is slipped over the end of the tube 222 and engaged in the groove 228. The body 250 is then placed in position with the down tube 250 extending down into the vapor removal tube, seals being formed by the O rings 280 and 282. The nut 240 is screwed on the body 250, in the area indicated at 254, where the two have mating threaded surfaces, thus forcing the body 250 down. As shown in FIG. 4, the tip of the down tube 252 is just barely clearing the breakseal 226. By further screwing down the body, the breakseal forces the disk 226 downwardly as shown in FIG. 6, breaking the fused portion around the end of the tube 222 and moving the disk breakseal 226 downwardly as shown in the arrow in FIG. 6. The seal having previously been formed, this procedure obviates any introduction of impurities into the system. One of the great advantages of this particular breakseal is that it can be made in virtually any desired size. All that is necessary is to provide an adequate thickness in the breakseal disk 226. Since this is simply a flat disk it is easily obtained in any desired thickness.

It will be understood that the connectors 34, 36 and 38 may be of the type described with respect to FIGS. 4 and 5 and that the conduits 24, 26 and 28 may be the vapor removal tubes 202, 212 and 222 as shown in FIG. 2.

Figure 7:
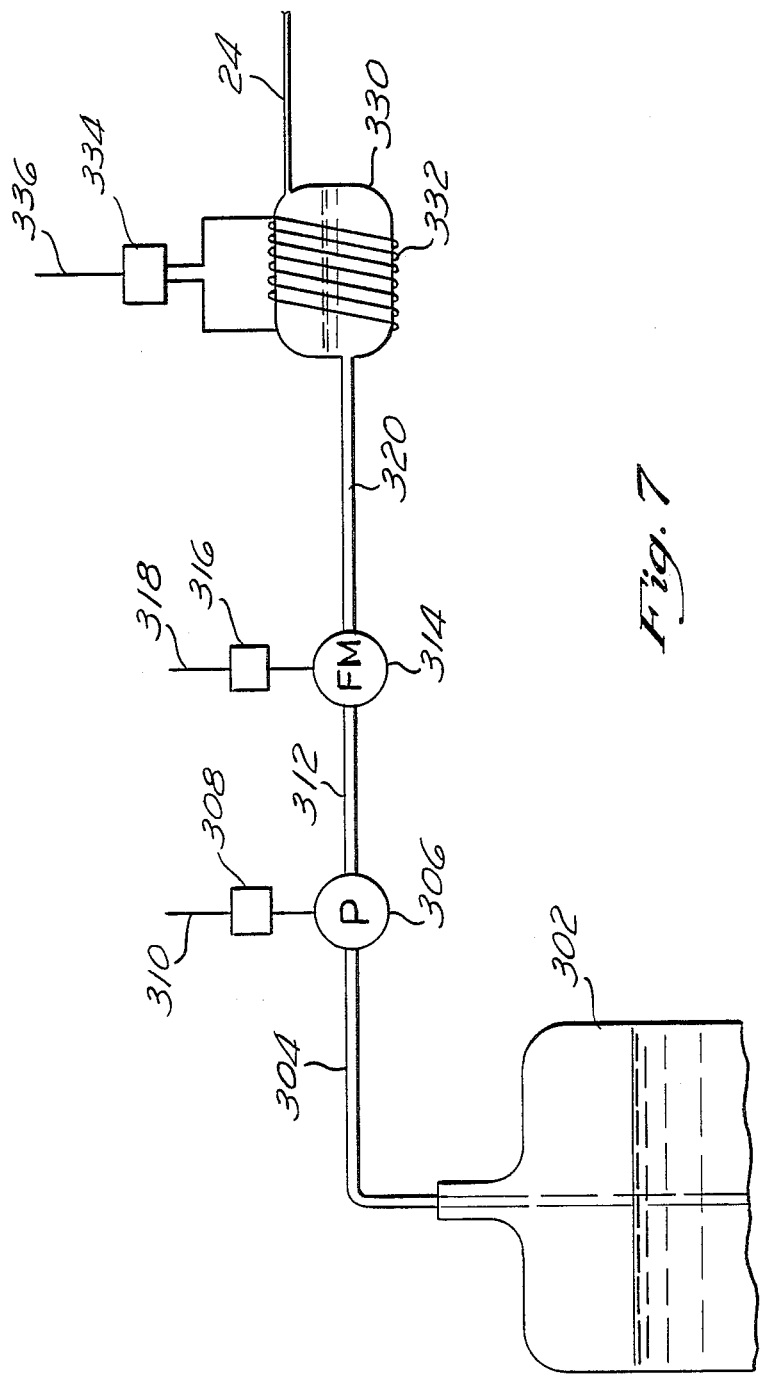
FIG. 7 is a schematic diagram of the improved multiple vapor, single source generator of this invention.

In an alternative embodiment, in which only one orifice is utilized, for example, through the conduit 24, is shown in FIG. 7.

In this particular advantageous embodiment, the reservoir 302 contains a mixture of the reagents to be used in the desired proportions. The proportions will be a function of the vapor pressure of the liquids, and are easily calculated using roualt's law.

The difficulty with using a mixed reagent source in the past has been that the composition of the vapors changes over a time. This disadvantage is over, according to the present invention by pumping the liquid out of the reservoir as the liquid and, thereafter, vaporizing it in a steady state vaporizing reactor.

With specific reference to FIG. 7, the reservoir 202 contains the mixed reagent which is removed through a conduit 304. The conduit 304, and the other conduits, except 24, may be very small, almost capillary conduits.

The conduit 24 is, as described in FIG. 1, a larger conduit for carrying gases at a very low pressure. Pump 306 is connected by a controller 308 and a line 310 to the VVTC as shown in FIG. 1 for controlling the pump rate and turning it on and off. The pump forces the mixed liquid reagent through the conduit 312 and through a flow meter 314, the output of which is transmitted through a transit 316 and line 318 to the VVTC shown in FIG. 1. The flow meter may be of any desired type which is non-contaminating and non-reactive with the reagents. One type of flow meter which is known in the industry measures the transit time of a single increment of liquid from the input to the output of the flow meter. A pulse of heat is injected into the flowing reagent near the input of the flow meter and this heat pulse is sensed near the output of the flow meter, the path being known and the time being determined, the rate of flow is then easily derived. Any other kind of flow meter made, however, be utilized.

The conduit 320 then carries the mixed liquid reagent, which is still at constant composition, to the evaporation chamber 330. The evaporation 330 is heated by any desired means as coil 332 being shown simply schematically as a heater, the heater being controlled by a controller 334 through a line 336 from the VVTC. Controlling the temperature in the reservoir 330 controls the vapor pressure applied through the conduit 24. Again, it is noted that in this embodiment only one of conduits would be used. Obviously, one would not use multiple orifice systems utilizing this invention.

Once the system as described with respect to FIG. 7 is in operation, a steady state condition will obtain in the vaporization chamber 330. Since the composition of the liquid being pumped into the chamber remains constant, once the vaporization chamber is at steady state conditions, the vapor produced and in being removed from the vaporization chamber will also be at constant composition, the composition of the vapor being exactly equal to the composition of the reagent in the reservoir 302.

It will be immediately apparent, once this invention is understood that there will great significant economical, technical and practical advantages to using a mixed reagent system, once the problem of getting the reagent into the vacuum system at constant composition has been solved. This invention, then, opens up opportunities for substantial economic and practical advances in the industry.

The invention resides in the overall system and in the combination of elements, the elements or components themselves being known. Reference is made to standard texts, treatises, and technical publications for specifics as to the components. Particular reference to devices, systems and components which may be used herein is made to KIRKOTHMER, "ENCYCLOPEDIA OF CHEMICAL TECHNOLOGY"; HANDBOOK OF THIN FILM TECHNOLOGY, McGraw-Hill; ENCYCLOPEDIA OF SEMICONDUCTOR TECHNOLOGY, Wiley Interscience; HANDBOOK OF CHEMICAL ENGINEERING; HANDBOOK OF COMPUTER SCIENCE AND ENGINEERING, Van Nostrand; HANDBOOK OF TRANSISTORS, SEMICONDUCTORS, INSTRUMENTS AND MICROELECTRONICS, Prentice Hall.

By the means described, the variables which control the flow rate, pressure, temperature and orifice size, may be controlled.

As previously described, it is known that the orifice 40 changes its effective diameter, presumably as a result of condensation or deposition in the orifice or reaction of various reagents with the orifice. It is important that the orifice size be maintained at a uniform size, or alternatively, if it is not possible to maintain the orifice at a predetermined size, it is important that the temperature of the vapor be controlled such that the net mass flow through the orifice may be controlled. Thus, it is possible to control the net mass flow through the orifice 40 by either controlling the orifice size or the temperature of the vapor.

In order to avoid the extremely complex, uncertain and hazardous approaches for calibration which have been utilized in the past, the following method and sequence of operation is carried out using the system of the invention.

During operation, the controller 38 and orifice are closed and there is no flow from the fixed gas system. Flow of the vapors from the reagent is as indicated through conduit 28 and 30 to the inlet of the orifice 40, through the orifice 40 and into the vacuum system. It is desirable during operation to assure that the pressure in the inlet system is at least twice the outlet pressure. To this end, the pressure on the outlet side of the orifice may be measured, as previously described, and the vapor pressure maintained at at least twice the outlet pressure.

At the end of every run, and before beginning another run, it is desirable to recalibrate or check the calibration of the orifice. In the previous practice, this was not done with every run because it was so time consuming and often so hazardous that it discouraged this procedure.

According to the present invention, a source of fixed gas, typically nitrogen, at a known mass flow rate is introduced into the conduit 30, during which period of time the vapor is cut off from the reservoir 22. Since the mass flow rate of the nitrogen into conduit 30 is known and the pressure in conduit 30 is known, the orifice, if it is adjustable, may be adjusted to permit the same mass flow as is flowing through the orifice 36. If the pressure in the conduit 30 is constant, then, of course, the same mass flow is flowing through the orifice 40 as is flowing through the orifice 36. The orifice 40 is adjusted such that it exactly maintains the pressure in conduit 30.

Alternatively, if it not feasible to adjust the size of the orifice 44, a set of calibration curves can be prepared correlating the pressure in conduit 30 or the pressure differential across the orifice 40 with the mass flow rate. With a given pressure relationship across the orifice, the mass flow of the orifice 40 is then known. Using the calibrating gas stream, nitrogen typically, one may select the appropriate calibration curve. A calibration curve may be made for orifices at very close increments thus making it possible to provide a calibration curve for any reasonably expected pressure differential.

Referring now to the embodiment of FIG. 2, a system as described but using a multiple reservoir is depicted. In FIG. 2, an enclosure 110, generally described with respect to FIG. 1, encloses a reservoir 120. In this embodiment, the reservoir has three chambers, an outer chamber indicated at 120, an inner chamber indicated at 120a and another inner chamber indicated at 120b, a temperature of all of the chambers being maintained by heater 124 and controller 126. As previously described, the outlet of the various reservoir components is fed into a conduit, respectively marked 130, 230 and 330. A source of calibrating gas at a known and controlled or controllable mass flow rate is indicated generally at 139, the details of the gas source being omitted for simplicity. A similar system is indicated at 239 and 339 for introduction, respectively, at a calibrating gas flow into conduit 130, 230, and 330. A controller system 150, which includes the orifice, the orifice control device, the microprocessor and sensors, is shown in the system connect into which 130 feeds. Likewise, conduit 230 feeds into control system 250 and conduit 330 feeds into control system 350. It will be understood that the details illustrated in FIG. 1 are omitted in FIG. 2 for simplicity.

The system of FIG. 2 is particularly valuable where multiple reagents are used. For example, one of the important techniques used in the manufacture of semiconductors now is in the formation of BPSG (borophosoilicate glass). In the formation of this glass coating on semiconductor devices, the boron containing constituent is contained in one reservoir, the phosphorus containing constituent is contained in another reservoir and the silicate containing constituent is contained in still another reservoir, the three constituents being introduced into the vacuum simultaneous therein reacting to form the borophosoilicate glass. For example, the reservoirs may contain, respectively, boron tribromide, phosphorus tribromide, and tetraethyl (ortho) silicate.

It will also be understood that separate reservoirs and separately heated reservoirs may be used in a combination system of the type shown in FIG. 2, the only difference being that each reservoir is separate from the other.

Making particular reference to the reservoir 120, however, it will be understood that this reservoir is typically formed of quartz with a large reservoir formed and 1 or 2 or 3, or perhaps even more, reservoirs formed inside the quartz vessel suspended from the top or roof of the envelop vessel. These devices may be formed separately and then fused together using conventional and normal quartz technology. The invention, thus also contemplates, a quartz multiple reservoir comprising an outer reservoir which encompasses at least one additional inner reservoir, with openings communicating from the outside to each of the reservoirs, respectively.

Industrial Application

This invention finds application in the manufacture of semiconductors and in providing reagents in vacuum furnace and other vacuum systems.

What is claimed is:

1. A method of introducing reagent into a vacuum chemical vapor reaction chamber comprising the steps of:
   (a) controlling the temperature of the reagent in a reagent vapor generator to thereby generate reagent vapor at a pressure, which pressure is proportional to and a predetermined function of the vapor pressure of the reagent at the temperature at which the reagent is controlled;
   (b) flowing the reagent vapor from the reagent vapor generator through a critical orifice into the vacuum chemical reaction chamber; and
   (c) controllably varying the rate of flow into the vacuum chemical reaction chamber by controllably varying the temperature of the reagent in the reagent vapor generator thereby controllably varying the vapor pressure of the reagent.

2. The method of claim 1 further comprising controlling the rate of flow of the reagent into the vacuum chemical reaction chamber by controlling the size of the critical orifice.

3. The method of claim 2 wherein the reagent vapor pressure is maintained at from 0.1 to 100 torr.

4. The method of claim 2 wherein the reagent vapor pressure is maintained at from 0.1 to 10 torr.

5. A system for introducing reagent into a vacuum chemical reaction chamber comprising:
   (a) a vacuum chemical reaction chamber;
   (b) means for generating a vapor of a reagent to be introduced into said vacuum chemical reaction chamber;
   (c) an orifice having an inlet side and an outlet side, the inlet side of the orifice being in fluid communication with the means for generating a vapor of a reagent;
   (d) conduit means in fluid communication with the orifice for flowing reagent vapor through the orifice to the vacuum chemical reaction chamber;
   (e) means for maintaining the pressure on the inlet side of the orifice at a pressure of from about 0.1 to about 100 torr at least twice the pressure of the vacuum chemical reaction chamber, to thereby operate the orifice as a critical or sonic orifice wherein the flow rate through the orifice is independent of the pressure on either the inlet side or the outlet side of the orifice and therefor independent of pressure changes in the vacuum chemical reaction chamber, the flow through the orifice being solely a function of the vapor pressure of the reagent in the means for generating a vapor of a reagent and the size of the sonic orifice.

6. The system of claim 5 further comprising calibrating means comprising a source of inert fixed gas and means for regulating the mass flow of gas through the orifice.

7. The system of claim 5 wherein the means for generating reagent vapor comprises an evaporation chamber, a heater for the evaporation chamber, means for pumping liquid reagent of constant composition into the evaporation chamber, and means for passing vapor from the evaporation chamber to the inlet side of the orifice.

8. The system of claim 5 wherein the means for generating a reagent vapor comprises a quartz or borosilicate glass vessel defining an outer reservoir and two inner reservoirs in the outer reservoir, each reservoir having means defining a fill opening and a vapor removal opening.

9. The system of claim 8 wherein the means defining vapor removal opening is closed during shipment by a breakseal comprising a thin edge at the end of the vapor removal opening and a disk fused to said thin edge.

10. A vapor generating and vacuum chemical reaction means comprising a liquid reagent evaporation chamber, means for heating the liquid contents of the evaporation chamber, means for flowing liquid reagent of constant composition into the evaporation chamber, a vacuum chemical reaction chamber, and means for passing vapor of the same composition as the inflowing reagent from the evaporation chamber to the vacuum chemical reaction chamber, said vapor passing means comprising an orifice and conduit means connecting the evaporation chamber and the vacuum chemical reaction chamber in fluid communication with each other through the orifice, the vapor generating and vacuum chemical reactions means being so constructed that the rate of flow of vapor through the vapor passing means is solely a function of the vapor pressure of the reagent in the evaporation chamber and the size of the orifice.

* * * * *